United States Patent
Wu (10) Patent No.: US 12,019,120 B2
(45) Date of Patent: Jun. 25, 2024

(54) METHOD AND DEVICE FOR EVALUATING PERFORMANCE OF SEQUENTIAL LOGIC ELEMENT

(71) Applicant: Changxin Memory Technologies, Inc., Anhui (CN)

(72) Inventor: Zengquan Wu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 156 days.

(21) Appl. No.: 17/872,479

(22) Filed: Jul. 25, 2022

(65) Prior Publication Data

US 2023/0384372 A1 Nov. 30, 2023

Related U.S. Application Data

(63) Continuation of application No. PCT/CN2022/096858, filed on Jun. 2, 2022.

(30) Foreign Application Priority Data

May 26, 2022 (CN) .......................... 202210582260.9

(51) Int. Cl.
*G01R 31/28* (2006.01)
*G01R 31/317* (2006.01)
(Continued)

(52) U.S. Cl.
CPC ....... *G01R 31/31725* (2013.01); *H03K 3/037* (2013.01); *H03K 5/01* (2013.01); *H03K 2005/00019* (2013.01)

(58) Field of Classification Search
CPC .... G01R 31/31725; H03K 3/037; H03K 5/01; H03K 2005/00019
See application file for complete search history.

(56) References Cited

U.S. PATENT DOCUMENTS 4,924,468 A 5/1990 Horak et al.
6,621,352 B2 * 9/2003 Matsumoto ........... H03L 7/0816
331/25

(Continued)

FOREIGN PATENT DOCUMENTS

| CN | 105991111 A | 10/2016 |
| CN | 111243635 A | 6/2020 |
| CN | 114397561 A | 4/2022 |

OTHER PUBLICATIONS

PCT International Search Report and the Written Opinion dated Dec. 19, 2022, issued in related International Application No. PCT/CN2022/096858 (17 pages).

*Primary Examiner* — Christine T. Tu
(74) *Attorney, Agent, or Firm* — Sheppard Mullin Richter & Hampton LLP (57) ABSTRACT

A method for evaluating performance of a sequential logic element includes: inputting a preset clock signal and a data signal to a sequential logic element to be tested; decrementing a setup time of the sequential logic element from a first preset value to a second preset value based on a preset decrement step, where the first preset value is determined by a setup time when the sequential logic element to be tested outputs a target sampled value, and the second preset value is determined by a setup time when the sequential logic element outputs a reverse value of the target sampled value; and determining an evaluation parameter of the sequential logic element based on a sampled value output by the sequential logic element after each decrement of the setup time, and evaluating performance of the sequential logic element based on the evaluation parameter of the sequential logic element to be tested.

20 Claims, 5 Drawing Sheets

(51) Int. Cl.
   *H03K 3/037*   (2006.01)
   *H03K 5/01*    (2006.01)
   *H03K 5/00*    (2006.01)

(56) References Cited

U.S. PATENT DOCUMENTS

| | | | |
|---|---|---|---|
| 2005/0028116 A1* | 2/2005 | Jang | G06F 30/33 |
| | | | 716/108 |
| 2014/0203857 A1* | 7/2014 | Allende | H03K 3/0375 |
| | | | 327/215 |
| 2016/0261257 A1 | 9/2016 | Huang | |

* cited by examiner

METHOD AND DEVICE FOR EVALUATING PERFORMANCE OF SEQUENTIAL LOGIC ELEMENT

CROSS-REFERENCE TO RELATED APPLICATIONS

This application is a continuation application of International Patent Application No. PCT/CN2022/096858, filed on Jun. 2, 2022, which claims priority to Chinese Patent Application No. 202210582260.9, filed with the China National Intellectual Property Administration on May 26, 2022 and entitled "METHOD AND DEVICE FOR EVALUATING PERFORMANCE OF SEQUENTIAL LOGIC ELEMENT". The above-referenced applications are incorporated herein by reference in their entirety.

TECHNICAL FIELD

Embodiments of the present disclosure relate to the field of semiconductor technologies, and in particular, to a method and a device for evaluating performance of a sequential logic element.

BACKGROUND

Currently, during design of an application-specific integrated circuit (ASIC) based on a standard cell library, a foundry usually provides a process design kit (PDK). The PDK includes design and feature parameters (for example, a setup time or a hold time) of sequential logic elements such as flip-flops and latches.

In the design and process development phase of a fully customized circuit, the sequential logic element may have different features, such as structures, MOS types, and the like. Therefore, it is desirable to develop techniques to evaluate the performance of the sequential logic element.

SUMMARY

Embodiments of the present disclosure provide a method and a device for evaluating performance of a sequential logic element, which can be used to effectively evaluate the performance of the sequential logic element.

According to a first aspect, the present disclosure provides a method for evaluating performance of a sequential logic element. The method includes: inputting a preset clock signal and a data signal to a sequential logic element to be tested, the sequential logic element to be tested being configured to sample the data signal based on the preset clock signal; decrementing a setup time of the sequential logic element to be tested from a first preset value to a second preset value based on a preset decrement step, and recording a sampled value output by the sequential logic element to be tested after each decrement of the setup time, the setup time being a time difference between a target edge of the clock signal and a target edge of a target sampled value in the data signal, the first preset value being determined by a setup time when the sequential logic element to be tested stably outputs the target sampled value, and the second preset value being determined by a setup time when the sequential logic element to be tested stably outputs a reverse value of the target sampled value; and determining an evaluation parameter of the sequential logic element to be tested based on the sampled value output by the sequential logic element to be tested after each decrement of the setup time, and evaluating performance of the sequential logic element to be tested based on the evaluation parameter.

In an exemplary implementation, the evaluation parameter includes an output delay average value, and the determining an evaluation parameter of the sequential logic element to be tested based on the sampled value output by the sequential logic element to be tested after each decrement of the setup time includes: determining, based on the sampled value output by the sequential logic element to be tested after each decrement of the setup time, a first setup time value of the sequential logic element to be tested when the sampled value output by the sequential logic element to be tested is toggled from the target sampled value to the reverse value of the target sampled value; calculating a first average value of delay durations between the target edge of the clock signal and the target sampled value output by the sequential logic element to be tested when each decrement is completed in a process of decrementing the setup time of the sequential logic element to be tested from the first preset value to the first setup time value; and determining the first average value as the output delay average value.

In an exemplary implementation, the evaluation parameter further includes a target setup time, and the determining an evaluation parameter of the sequential logic element to be tested based on the sampled value output by the sequential logic element to be tested after each decrement of the setup time includes: selecting a plurality of smallest delay durations from the delay durations; calculating a sum of an average value of the selected delay durations and a fixed delay offset of the sequential logic element to be tested; and determining a setup time corresponding to the sum of the average value and the fixed delay offset as the target setup time.

In an exemplary implementation, the evaluation parameter further includes a metastable time, and the determining an evaluation parameter of the sequential logic element to be tested based on the sampled value output by the sequential logic element to be tested after each decrement of the setup time includes: drawing a curve reflecting the delay duration changes with a number of decrements of the setup time, and determining an inflection point and a peak value of the curve; and obtaining a difference between setup times corresponding to the peak value and the inflection point, and using the difference as the metastable time.

In an exemplary implementation, the evaluation parameter further includes a target hold time, and the method further includes: decrementing a hold time of the sequential logic element to be tested from a third preset value to a fourth preset value based on the preset decrement step, and recording a sampled value output by the sequential logic element to be tested after each decrement of the hold time, where the hold time is a time for which the data signal remains stable after the target edge of the clock signal, the third preset value is determined by a hold time when the sequential logic element to be tested stably outputs the target sampled value, and the fourth preset value is determined by a hold time when the sequential logic element to be tested stably outputs the reverse value of the target sampled value; determining, based on the sampled value output by the sequential logic element to be tested after each decrement of the hold time, a first hold time value of the sequential logic element to be tested when the sampled value output by the sequential logic element to be tested is toggled from the target sampled value to the reverse value of the target sampled value; and determining the first hold time value as the target hold time.

In an exemplary implementation, the data signal includes a first data signal and a second data signal with opposite phases, the clock signal includes a first clock signal and a second clock signal with opposite phases, and the sequential logic element to be tested includes a first sequential logic element to be tested and a second sequential logic element to be tested; and the inputting a preset clock signal and a data signal to a sequential logic element to be tested includes: inputting the first clock signal and the first data signal to the first sequential logic element to be tested to sample the first data signal by using the first clock signal, and inputting the second clock signal and the second data signal to the second sequential logic element to be tested to sample the second data signal by using the second clock signal.

In an exemplary implementation, the evaluation parameter further includes at least one of the following evaluation parameters: a maximum output delay, which is the larger one of an output delay average value corresponding to the first sequential logic element to be tested and an output delay average value corresponding to the second sequential logic element to be tested; a maximum setup time, which is the larger one of a target setup time corresponding to the first sequential logic element to be tested and a target setup time corresponding to the second sequential logic element to be tested; a maximum hold time, which is the larger one of a target hold time corresponding to the first sequential logic element to be tested and a target hold time corresponding to the second sequential logic element to be tested; an uncertain time interval, which is a sum of the maximum setup time and the maximum hold time; a maximum metastable time, which is the larger one of a metastable time corresponding to the first sequential logic element to be tested and a metastable time corresponding to the second sequential logic element to be tested; a setup time deviation, which is an absolute value of a difference between the target setup time corresponding to the first sequential logic element to be tested and the target setup time corresponding to the second sequential logic element to be tested; and a hold time deviation, which is an absolute value of a difference between the target hold time corresponding to the first sequential logic element to be tested and the target hold time corresponding to the second sequential logic element to be tested.

According to a second aspect, the present disclosure provides an apparatus for evaluating performance of a sequential logic element. The apparatus includes: an input module, configured to input a preset clock signal and a data signal to a sequential logic element to be tested, the sequential logic element to be tested being configured to sample the data signal based on the preset clock signal; an adjustment module, configured to decrement a setup time of the sequential logic element to be tested from a first preset value to a second preset value based on a preset decrement step, and record a sampled value output by the sequential logic element to be tested after each decrement of the setup time, the setup time being a time difference between a target edge of the clock signal and a target edge of a target sampled value in the data signal, the first preset value being determined by a setup time when the sequential logic element to be tested stably outputs the target sampled value, and the second preset value being determined by a setup time when the sequential logic element to be tested stably outputs a reverse value of the target sampled value; and an evaluation module, configured to determine an evaluation parameter of the sequential logic element to be tested based on the sampled value output by the sequential logic element to be tested after each decrement of the setup time, and evaluate performance of the sequential logic element to be tested based on the evaluation parameter.

In an exemplary implementation, the evaluation parameter includes an output delay average value, and the evaluation module is configured to determine, based on the sampled value output by the sequential logic element to be tested after each decrement of the setup time, a first setup time value of the sequential logic element to be tested when the sampled value output by the sequential logic element to be tested is toggled from the target sampled value to the reverse value of the target sampled value; calculate a first average value of delay durations between the target edge of the clock signal and the target sampled value output by the sequential logic element to be tested when each decrement is completed in a process of decrementing the setup time of the sequential logic element to be tested from the first preset value to the first setup time value; and determine the first average value as the output delay average value.

In an exemplary implementation, the evaluation parameter further includes a target setup time, and the evaluation module is further configured to select a plurality of smallest delay durations from the delay durations; calculate a sum of an average value of the selected delay durations and a fixed delay offset of the sequential logic element to be tested; and determine a setup time corresponding to the sum of the average value and the fixed delay offset as the target setup time.

In an exemplary implementation, the evaluation parameter further includes a metastable time, and the evaluation module is further configured to draw a curve reflecting the delay duration changes with a number of decrements of the setup time, and determine an inflection point and a peak value of the curve; and obtain a difference between setup times corresponding to the peak value and the inflection point, and use the difference as the metastable time.

In an exemplary implementation, the evaluation parameter further includes a target hold time, and the adjustment module is further configured to decrement a hold time of the sequential logic element to be tested from a third preset value to a fourth preset value based on the preset decrement step, and record a sampled value output by the sequential logic element to be tested after each decrement of the hold time, where the hold time is a time for which the data signal remains stable after the target edge of the clock signal, the third preset value is determined by a hold time when the sequential logic element to be tested stably outputs the target sampled value, and the fourth preset value is determined by a hold time when the sequential logic element to be tested stably outputs the reverse value of the target sampled value; and the evaluation module is further configured to determine, based on the sampled value output by the sequential logic element to be tested after each decrement of the hold time, a first hold time value of the sequential logic element to be tested when the sampled value output by the sequential logic element to be tested is toggled from the target sampled value to the reverse value of the target sampled value; and determine the first hold time value as the target hold time.

In an exemplary implementation, the data signal includes a first data signal and a second data signal with opposite phases, the clock signal includes a first clock signal and a second clock signal with opposite phases, and the sequential logic element to be tested includes a first sequential logic element to be tested and a second sequential logic element to be tested; and the input module is configured to input the first clock signal and the first data signal to the first sequential logic element to be tested to sample the first data signal by using the first clock signal, and input the second clock signal and the second data signal to the second sequential logic element to be tested to sample the second data signal by using the second clock signal.

In an exemplary implementation, the evaluation parameter further includes at least one of the following evaluation parameters: a maximum output delay, which is the larger one of an output delay average value corresponding to the first sequential logic element to be tested and an output delay average value corresponding to the second sequential logic element to be tested; a maximum setup time, which is the larger one of a target setup time corresponding to the first sequential logic element to be tested and a target setup time corresponding to the second sequential logic element to be tested; a maximum hold time, which is the larger one of a target hold time corresponding to the first sequential logic element to be tested and a target hold time corresponding to the second sequential logic element to be tested; an uncertain time interval, which is a sum of the maximum setup time and the maximum hold time; a maximum metastable time, which is the larger one of a metastable time corresponding to the first sequential logic element to be tested and a metastable time corresponding to the second sequential logic element to be tested; a setup time deviation, which is an absolute value of a difference between the target setup time corresponding to the first sequential logic element to be tested and the target setup time corresponding to the second sequential logic element to be tested; and a hold time deviation, which is an absolute value of a difference between the target hold time corresponding to the first sequential logic element to be tested and the target hold time corresponding to the second sequential logic element to be tested.

According to a third aspect, the present disclosure provides an electronic device, including at least one processor and a memory.

The memory stores computer executable instructions.

The at least one processor executes the computer executable instructions stored in the memory, so that the at least one processor performs the method for evaluating performance of a sequential logic element according to the first aspect.

According to a fourth aspect, the present disclosure provides a non-transitory computer-readable storage medium. The non-transitory computer-readable storage medium is configured with instructions executable by one or more processors to cause the one or more processors to perform operations including: inputting a preset clock signal and a data signal to a sequential logic element to be tested, the sequential logic element to be tested being configured to sample the data signal based on the preset clock signal; decrementing a setup time of the sequential logic element to be tested from a first preset value to a second preset value based on a preset decrement step, and recording a sampled value output by the sequential logic element to be tested after each decrement of the setup time, the setup time being a time difference between a target edge of the clock signal and a target edge of a target sampled value in the data signal, the first preset value being determined by a setup time when the sequential logic element to be tested outputs the target sampled value, and the second preset value being determined by a setup time when the sequential logic element to be tested outputs a reverse value of the target sampled value; and determining an evaluation parameter of the sequential logic element to be tested based on the sampled value output by the sequential logic element to be tested after each decrement of the setup time, and evaluating performance of the sequential logic element to be tested based on the evaluation parameter.

In the method and the device for evaluating performance of a sequential logic element provided in the embodiments of the present disclosure, the setup time of the sequential logic element to be tested is gradually decremented, so that output of the sequential logic element to be tested can be toggled from the target sampled value to the reverse value of the target sampled value. Some evaluation parameters of the sequential logic element to be tested when the output of the sequential logic element to be tested is toggled from the target sampled value to the reverse value of the target sampled value are measured or calculated, and the performance of the sequential logic element to be tested can be effectively evaluated based on the evaluation parameters, so that the performance of the sequential logic element to be tested can be improved, or an actual circuit or time sequence is designed or improved based on the performance of the sequential logic element.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. Clearly, the described embodiments are merely some rather than all of the embodiments of the present disclosure. All other embodiments obtained by a person of ordinary skill in the art based on the embodiments of the present disclosure without creative efforts shall fall within the protection scope of the present disclosure. In addition, although the content disclosed in the present disclosure is described based on one or more example instances, it should be understood that each aspect of the content disclosed may also constitute a complete implementation.

It should be noted that brief descriptions of the terms in the present disclosure are merely intended to facilitate understanding of the following described implementations, but are not intended to limit the embodiments of the present disclosure. Unless otherwise stated, these terms should be understood in accordance with their ordinary and usual meanings.

In the specification, claims, and accompanying drawings of the present disclosure, the terms "first", "second", and so on are intended to distinguish between similar or same objects or entities but do not necessarily indicate a specific order, unless otherwise stated. It should be understood that the terms used in such a way may be interchangeable in appropriate circumstances, for example, may be implemented in other orders than those shown in the figure or described in the embodiments of the present disclosure.

Moreover, the terms "include", "contain", and any other variants mean to cover the non-exclusive inclusion, for example, a product or a device that includes a series of components is not necessarily limited to those components expressly listed, but may include other components not expressly listed or inherent to such a product or device.

The term "module" used in the embodiments of the present disclosure refers to any known or later developed hardware, software, firmware, artificial intelligence, fuzzy logic or a combination of hardware and/or software code that can perform functions related to the element.

In the field of semiconductor technologies, in the design procedure of an ASIC based on a standard cell library, a chip designer designs a chip by using a hardware description language. That is, a chip function is modelled, design code is integrated into a standard cell circuit by using automated design software, and the standard cell circuit is further converted into a graphic data stream (GDS) layout that can be manufactured in a corresponding manufacturing process by using a physical backend design. Finally, a foundry produces the chip.

During the design of the ASIC based on the standard cell library, the foundry usually provides a process design kit (PDK) in advance. The PDK includes design and feature parameters (for example, a setup time or a hold time) of some sequential logic elements.

In some embodiments, the sequential logic elements may be a latch, a flip-flop (FF), and the like.

The latch is a memory cell circuit sensitive to a pulse level, and a state of the latch may change under an action of a specific input pulse level. Latching means temporarily storing a signal to maintain a level state. In a digital circuit, binary digital signals "0" and "1" (a reverse value for each other) can be recorded.

The flip-flop, also referred to as a bistable gate, is a component that has two stable states and is used for storage, and can record binary digital signals "1" and "0". Output of the flip-flop is determined by data input at a moment specified by an input clock.

A setup time of a sequential logic element is a minimum period of time for which a signal of a data input end needs to remain stable before an edge of a clock signal arrives. A hold time is a minimum period of time for which the signal of the data input end needs to remain stable after the edge of the clock signal.

It may be understood that, ideally, the sequential logic element can correctly collect data provided that valid data arrives when the edge of the clock signal arrives (or before the edge of the clock signal arrives). Output of the sequential logic element is not affected even if data changes after (or at) the edge of the clock signal.

However, in practice, it takes time to close a switch for the clock edge and change a state of a logic gate (for example, charge/discharge a capacitor). Therefore, it needs to take some time to collect data. The data cannot change within the time. In other words, the data needs to be maintained for a minimum period of time for preparation before the edge of the clock signal arrives. The minimum period of time is the foregoing setup time. In addition, it also takes time to open a switch for the clock edge. If the data changes within the time, new data may be transmitted to the next level, and an error occurs. Therefore, the data needs to remain unchanged for some time. In other words, the data cannot change within a minimum period of time after the edge of the clock signal arrives. The minimum period of time is the foregoing hold time.

Figure 1:
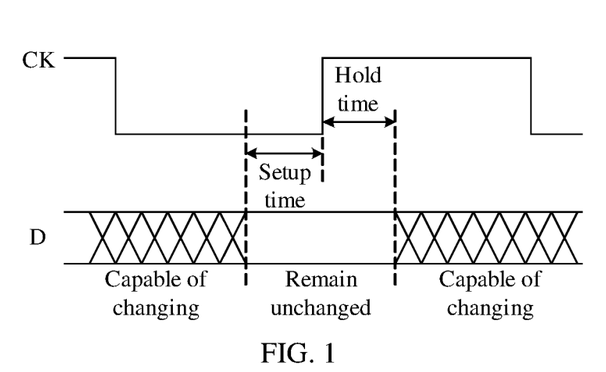
FIG. 1 is a schematic diagram illustrating a setup time and a hold time of a sequential logic element according to an embodiment of the present disclosure.

For better understanding of the embodiments of the present disclosure, references can be made to FIG. 1. FIG. 1 is a schematic diagram illustrating a setup time and a hold time of a sequential logic element according to an embodiment the present disclosure.

In FIG. 1, before a rising edge of a clock signal CK arrives, a data signal D needs to be maintained for a minimum period of time for preparation and cannot change. The minimum period of time is the setup time. In addition, after the rising edge of the clock signal CK arrives, the data D still needs to remain unchanged within a minimum period of time. The minimum period of time is the hold time.

Currently, in a design and process development phase of a fully customized circuit, the sequential logic element may have different designs (including structures, MOS types, and the like), making it more difficult to evaluate the performance of the sequential logic element.

To resolve the foregoing technical problem, the embodiments of the present disclosure provide a method for evaluating performance of a sequential logic element. A setup time of a sequential logic element to be tested is gradually decremented, so that output of the sequential logic element to be tested can be toggled from a target sampled value to a reverse value of the target sampled value. Some evaluation parameters of the sequential logic element to be tested when the output of the sequential logic element to be tested is toggled from the target sampled value to the reverse value of the target sampled value are measured or calculated, and performance of the sequential logic element to be tested can be effectively evaluated based on the evaluation parameters, so that the performance of the sequential logic element to be tested is improved. For specific implementations, references can be made to content in the following embodiments.

Figure 2:
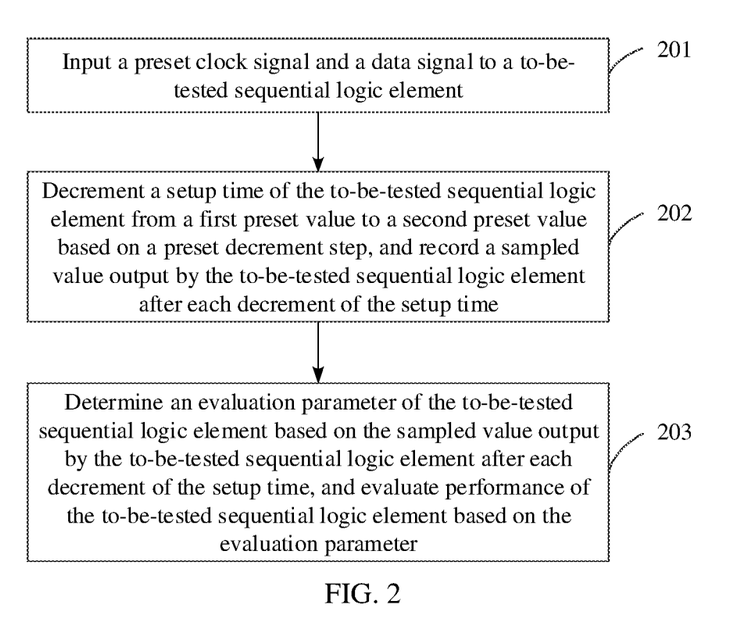
FIG. 2 is a schematic flowchart illustrating steps of a method for evaluating performance of a sequential logic element according to an embodiment of the present disclosure.

FIG. 2 is a schematic flowchart illustrating steps of a method for evaluating performance of a sequential logic element according to an embodiment of the present disclosure. In some embodiments of the present disclosure, the method for evaluating performance of a sequential logic element includes the following steps.

S201. Input a preset clock signal and a data signal to a sequential logic element to be tested.

In some implementations, a test platform may be established in advance, and a sequential logic circuit is simulated by using software in the test platform. The sequential logic circuit includes the sequential logic element to be tested.

The to-be-tested time sequential logic element may sample the data signal based on the clock signal.

In some embodiments, the sequential logic element may include a latch, a flip-flop, and the like.

In some implementations, a suitable clock cycle may be selected in advance. For example, in some embodiments of the present disclosure, a clock signal CK with a clock cycle of 2.5 ns and a duty cycle of 50% may be used.

In some implementations, a pulse width of the data signal may be preset. For example, in some embodiments of the present disclosure, a data signal D of a pulse width of 675 ps may be used.

S202. Decrement a setup time of the sequential logic element to be tested from a first preset value to a second preset value based on a preset decrement step, and record a sampled value output by the sequential logic element to be tested after each decrement of the setup time.

The setup time is a time difference between a target edge of the clock signal and a target edge of a target sampled value in the data signal. The first preset value is determined by a setup time when the sequential logic element to be tested stably outputs the target sampled value, and the second preset value is determined by a setup time when the sequential logic element to be tested stably outputs a reverse value of the target sampled value.

In an exemplary implementation, a general setup time of the sequential logic element to be tested may be first determined, and then the first preset value may be determined based on the general setup time of the sequential logic element to be tested.

In some embodiments, the first preset value is greater than the general setup time of the sequential logic element to be tested, so that when the sequential logic element to be tested uses the first preset value as the setup time, the sequential logic element to be tested can stably output the target sampled value.

It may be understood that when the setup time of the sequential logic element to be tested is less than the general setup time corresponding to the sequential logic element to be tested, the sequential logic element to be tested may output the reverse value of the target sampled value because the sequential logic element to be tested cannot collect the target sampled value, or output the target sampled value at a relatively high delay. In some embodiments of the present disclosure, a value that is far less than the general setup time may be selected as the second preset value, so that when the sequential logic element to be tested uses the second preset value as the setup time, the sequential logic element to be tested can stably output the reverse value of the target sampled value.

When the target sampled value is "1", the reverse value of the target sampled value is "0"; or when the target sampled value is "0", the reverse value of the target sampled value is "1".

In some embodiments, the second preset value may be negative, that is, the target edge of the target sampled value in the data signal may follow the target edge of the clock signal, so that the sequential logic element to be tested cannot collect the target sampled value.

Figure 3:
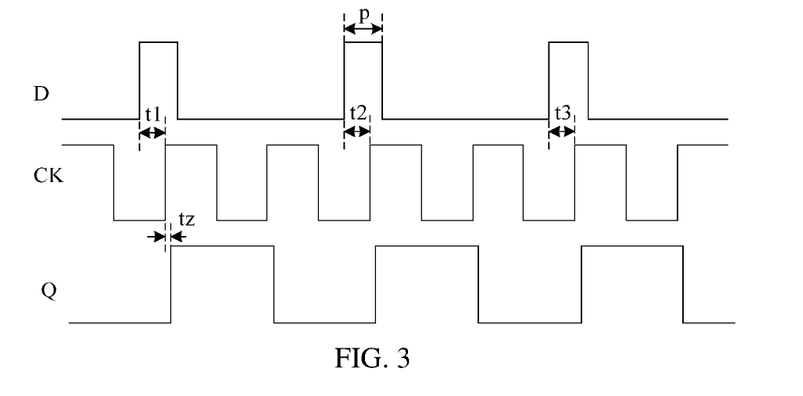
FIG. 3 is a schematic diagram illustrating sequential logic according to an embodiment of the present disclosure.

For better understanding of the embodiments of the present disclosure, references can be made to FIG. 3. FIG. 3 is a schematic diagram illustrating sequential logic according to an embodiment of the present disclosure.

In FIG. 3, assuming that a pulse width p of the data signal D is equal to 675 ps, and the setup time is a time difference between a moment corresponding to a rising edge of the clock signal CK and a moment corresponding to a rising edge of the data signal D.

It may be understood that when the rising edge of the data signal D precedes the rising edge of the clock signal CK, the setup time is a positive value; or when the rising edge of the data signal D follows the rising edge of the clock signal CK, the setup time is a negative value.

In an exemplary implementation, assuming that a minimum hold time of the sequential logic element to be tested is 25 ps, a maximum value of the first preset value may be 650 ps.

In some embodiments, the second preset value may be −420 ps.

It should be noted that the foregoing values of the first preset value and the second preset value are merely examples. In other embodiments, other values may be selected.

In a simulation process, for each time of sampling of the sequential logic element to be tested, the setup time of the sequential logic element to be tested is decremented based on the preset decrement step, and a sampled value output by the sequential logic element to be tested during each time of sampling is recorded.

For example, as shown in FIG. 3, assuming that the decrement step is 1 ps, a setup time t1 is 650 ps when a target sampled value 1 is collected the first time, a setup time t2 is 649 ps when 1 is collected the second time, a setup time t3 is 648 ps when 1 is collected the third time, and so on, until a setup time is −420 ps when 1 is collected the last time.

S203. Determine an evaluation parameter of the sequential logic element to be tested based on the sampled value output by the sequential logic element to be tested after each decrement of the setup time, and evaluate performance of the sequential logic element to be tested based on the evaluation parameter.

It may be understood that after the setup time of the sequential logic element to be tested is decremented to a specific value, the sequential logic element to be tested outputs a reverse value 0 of the target sampled value 1 because the sequential logic element to be tested cannot collect the target sampled value. Therefore, in some embodiments of the present disclosure, some evaluation parameters may be preset, for example, an output delay, a setup time, a hold time, and a metastable time when output of the sequential logic element to be tested is toggled from 1 to 0. After the simulation is completed, a critical point at which the output of the sequential logic element to be tested is toggled from 1 to 0 is determined based on the sampled value output by the sequential logic element to be tested after each decrement of the setup time, and then a value of the evaluation parameter at the critical point is detected or calculated.

After the value of the evaluation parameter at the critical point is detected or calculated, a performance evaluation result of the sequential logic element may be obtained based on the evaluation parameter and a performance evaluation criterion corresponding to the evaluation parameter.

In the method for evaluating performance of a sequential logic element provided in this embodiment of the present disclosure, the setup time of the sequential logic element to be tested is gradually decremented, so that the output of the sequential logic element to be tested can be toggled from the target sampled value to the reverse value of the target sampled value. Some evaluation parameters of the sequential logic element to be tested when the output of the sequential logic element to be tested is toggled from the target sampled value to the reverse value of the target sampled value are measured or calculated, and the performance of the sequential logic element to be tested can be effectively evaluated based on the evaluation parameters, so that the performance of the sequential logic element to be tested is improved.

Based on the content described in the foregoing embodiment, in some embodiments of the present disclosure, the evaluation parameter includes an output delay average value, and the determining an evaluation parameter of the sequential logic element to be tested based on the sampled value output by the sequential logic element to be tested after each decrement of the setup time in step S203 includes: determining, based on the sampled value output by the sequential logic element to be tested after each decrement of the setup time, a first setup time value of the sequential logic element to be tested when the sampled value output by the sequential logic element to be tested is toggled from the target sampled value to the reverse value of the target sampled value; calculating a first average value of delay durations between the target edge of the clock signal and the target sampled value output by the sequential logic element to be tested when each decrement is completed in a process of decrementing the setup time of the sequential logic element to be tested from the first preset value to the first setup time value; and determining the first average value as the output delay average value.

It may be understood that after an edge of the clock signal arrives, the target sampled value of the data signal cannot be immediately transmitted to an output end of the sequential logic element. The waiting time is a clock-to-output delay of the sequential logic element, namely, the foregoing delay duration, which may also be understood as a sum of delays inside the sequential logic element from the time when a clock is triggered to the time when valid data is output.

As shown in FIG. 3, a delay duration from the time when the clock is triggered to the time when valid data Q is output is tz.

It may be understood that when the setup time of the sequential logic element is sufficient, the data signal is also relatively stable when the edge of the clock signal arrives. Therefore, the clock-to-output delay of the sequential logic element is also relatively small and stable. When the setup time of the sequential logic element is insufficient, the data signal may not be stable when the edge of the clock signal arrives. Therefore, the clock-to-output delay of the sequential logic element also increases. A less sufficient setup time results in a larger clock-to-output delay of the sequential logic element. When the setup time of the sequential logic element is decremented to the time when the target sampled value cannot be collected at the edge of the clock signal, the sequential logic element fails to output the target sampled value, and in this case, the clock-to-output delay of the sequential logic element is zero.

Figure 4:
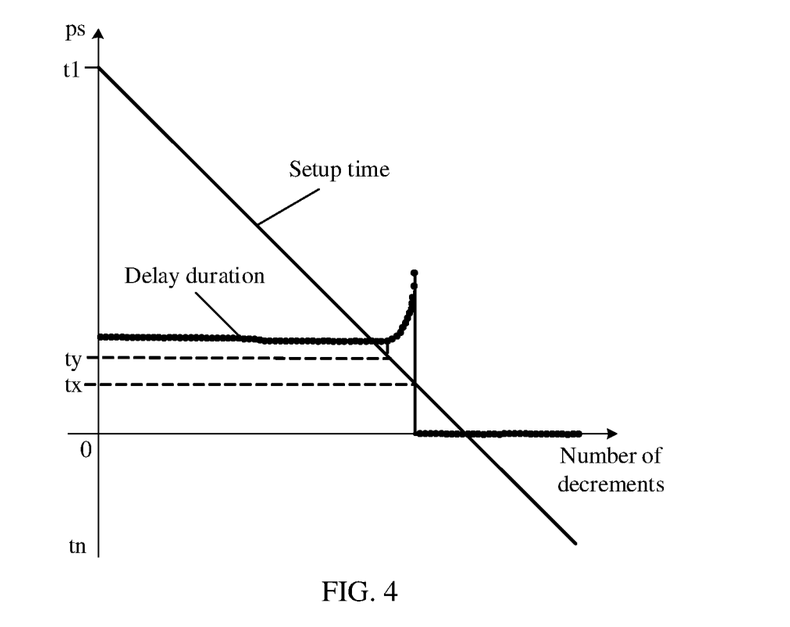
FIG. 4 is a schematic diagram illustrating a relationship between a delay duration and a setup time according to an embodiment of the present disclosure.

For better understanding of the embodiments of the present disclosure, references can be made to FIG. 4. FIG. 4 is a schematic diagram illustrating a relationship between a delay duration and a setup time according to an embodiment of the present disclosure.

In FIG. 4, t1 represents the first preset value, tn represents the second preset value, a horizontal coordinate represents a number of decrements of the setup time, and a vertical coordinate represents time (measured in a unit of ps).

It can be learned from FIG. 4 that in a process of decrementing the setup time of the sequential logic element to be tested from t1 to ty, the delay duration is relatively small and stable. In a process of decrementing the setup time of the sequential logic element to be tested from ty to tx, the delay duration gradually increases, and then suddenly changes to 0. Then, in a process of decrementing the setup time of the sequential logic element to be tested from tx to tn, the delay duration always remains at 0.

When the setup time of the sequential logic element to be tested is decremented to tx, the delay duration suddenly changes to 0. Therefore, it can be learned that when the setup time of the sequential logic element to be tested is decremented to tx, the sequential logic element fails to output the target sampled value. In other words, it may be determined that the first setup time value of the sequential logic element to be tested when the sampled value output by the sequential logic element to be tested is toggled from the target sampled value to the reverse value of the target sampled value is tx.

In some embodiments, a corresponding value of the delay duration when each decrement is completed in the process of decrementing the setup time of the sequential logic element to be tested from t1 to tx may be recorded. Then an average value of recorded delay durations is calculated, and the average value is used as the output delay average value.

In the method for evaluating performance of a sequential logic element provided in this embodiment of the present disclosure, the setup time of the sequential logic element to be tested is gradually decremented, so that the output of the sequential logic element to be tested can be toggled from the target sampled value to the reverse value of the target sampled value. The output delay average value of the sequential logic element to be tested before the output of the sequential logic element to be tested is toggled from the target sampled value to the reverse value of the target sampled value is measured or calculated, so that the delay performance of the sequential logic element to be tested can be effectively evaluated.

In some embodiments of the present disclosure, the evaluation parameter further includes a target setup time, and the determining an evaluation parameter of the sequential logic element to be tested based on the sampled value output by the sequential logic element to be tested after each decrement of the setup time in step S203 further includes: selecting a plurality of smallest delay durations from the delay durations, where the selected smallest delay durations are not greater than other delay durations; calculating a sum of an average value of the selected delay durations and a fixed delay offset of the sequential logic element to be tested; and determining a setup time corresponding to the sum of the average value and the fixed delay offset as the target setup time.

Still referring to FIG. 4, in some embodiments of the present disclosure, a corresponding value of the delay duration when each decrement is completed in the process of decrementing the setup time of the sequential logic element to be tested from t1 to tx may be recorded, and then some (for example, 100) smallest delay durations may be selected from recorded delay durations.

A sum of an average value of the selected delay durations and the fixed delay offset of the sequential logic element to be tested is calculated and denoted as tc. A setup time corresponding to the sequential logic element to be tested when the delay duration corresponding to the sequential logic element to be tested is tc is found from FIG. 4, and the setup time is determined as the target setup time. It may be understood that the fixed delay offset of the sequential logic element to be tested refers to an inherent transmission delay of the sequential logic element to be tested for the data signal or a difference between a first inherent transmission delay of the data signal and a second inherent transmission delay of the clock signal.

In the method for evaluating performance of a sequential logic element provided in this embodiment of the present disclosure, a plurality of smallest delay durations are selected from the recorded delay durations, and then the average value of the selected delay durations is calculated, so that a target setup time corresponding to the sequential logic element when the sequential logic element is in an optimal output state can be determined, and whether the setup time of the sequential logic element to be tested is an optimal setup time can be evaluated based on the target setup time.

In some embodiments of the present disclosure, the evaluation parameter further includes a metastable time, and the determining an evaluation parameter of the sequential logic element to be tested based on the sampled value output by the sequential logic element to be tested after each decrement of the setup time in step S203 further includes: drawing a curve reflecting the delay duration changes with a number of decrements of the setup time, and determining an inflection point and a peak value of the curve; and obtaining a difference between setup times corresponding to the peak value and the inflection point, and using the difference as the metastable time.

Figure 5:
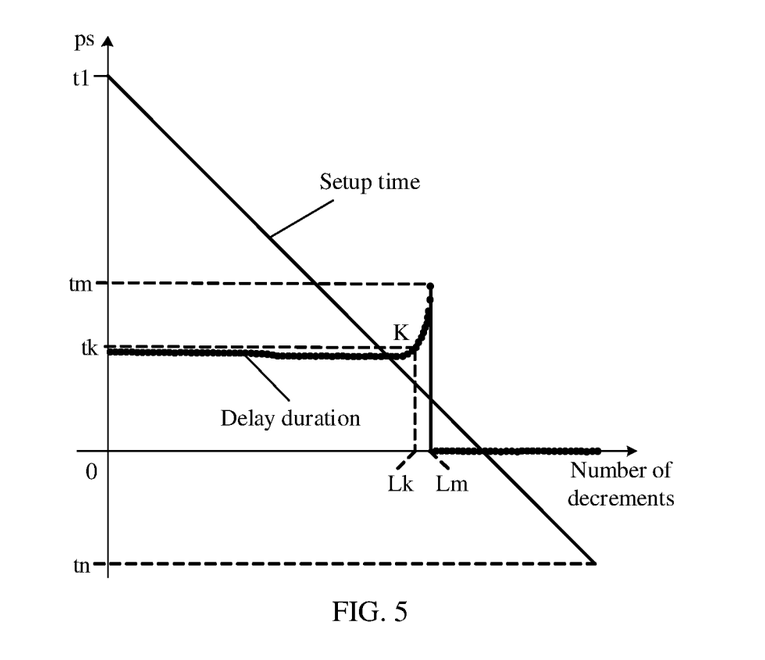
FIG. 5 is a schematic diagram illustrating a relationship between a delay duration and a setup time according to an embodiment of the present disclosure.

For better understanding of the embodiments of the present disclosure, references can be made to FIG. 5. FIG. 5 is a schematic diagram illustrating a relationship between a delay duration and a setup time according to an embodiment of the present disclosure.

In FIG. 5, t1 represents the first preset value, to represents the second preset value, a horizontal coordinate represents a number of decrements of the setup time, a vertical coordinate represents time (measured in a unit of ps), and the decrement step is 1 ps.

In some embodiments of the present disclosure, assuming that the inflection point of the curve reflecting the delay duration changes with the number of decrements of the setup time is a point K, delay duration corresponding to the inflection point K is tk, a number of decrements corresponding to the inflection point K is Lk, a setup time corresponding to the inflection point K is t1-Lk, the peak value is tm, a number of decrements corresponding to the peak value is Lm, and a setup time corresponding to the peak value is t1-Lm, The metastable time may be calculated in the following manner:

Metastable time=$Lm-Lk$

In the method for evaluating performance of a sequential logic element provided in this embodiment of the present disclosure, the metastable time of the sequential logic element to be tested when the output of the sequential logic element to be tested is toggled from the target sampled value to the reverse value of the target sampled value is measured or calculated, so that the metastable time of the sequential logic element to be tested can be evaluated.

In some embodiments of the present disclosure, the evaluation parameter further includes a target hold time. In some embodiments, a hold time of the sequential logic element to be tested may be decremented from a third preset value to a fourth preset value based on the preset decrement step, a first hold time value of the sequential logic element to be tested when a sampled value output by the sequential logic element to be tested after each decrement of the hold time is toggled from the target sampled value to the reverse value of the target sampled value may be determined based on the sampled value output by the sequential logic element to be tested, and the first hold time may be determined as the target hold time.

The hold time is a time for which the data signal remains stable after the target edge of the clock signal, the third preset value is determined by a hold time when the sequential logic element to be tested stably outputs the target sampled value, and the fourth preset value is determined by a hold time when the sequential logic element to be tested stably outputs the reverse value of the target sampled value.

In an exemplary implementation, a general hold time of the sequential logic element to be tested may be first determined, and then the third preset value may be determined based on the general hold time of the sequential logic element to be tested.

It may be understood that when the hold time of the sequential logic element to be tested is less than the general hold time corresponding to the sequential logic element to be tested, the sequential logic element to be tested outputs the reverse value of the target sampled value because the sequential logic element to be tested cannot collect the target sampled value. In some embodiments of the present disclosure, a value that is far less than the general hold time may be selected as the fourth preset value, so that when the sequential logic element to be tested uses the fourth preset value as the hold time, the sequential logic element to be tested can stably output the reverse value of the target sampled value.

In some embodiments, because the sequential logic element to be tested has an inherent transmission delay for the data signal, before the data signal is input to the sequential logic element to be tested, even if the hold time is a negative value, in other words, a falling edge of the data signal precedes the rising edge of the clock signal, the hold time may be converted to a positive value in an actual sampling process, in other words, the hold time plus a deviation value is a positive value. In other words, the finally calculated target hold time may be a negative value.

In some embodiments, the evaluation parameter may further include an average current. The average current is an average current in the whole simulation time period.

In the method for evaluating performance of a sequential logic element provided in this embodiment of the present disclosure, the hold time of the sequential logic element to be tested when the output of the sequential logic element to be tested is toggled from the target sampled value to the reverse value of the target sampled value is measured or calculated, so that the hold time of the sequential logic element to be tested can be evaluated.

Based on the content described in the foregoing embodiment, in some embodiments of the present disclosure, the data signal includes a first data signal and a second data signal with opposite phases, the clock signal includes a first clock signal and a second clock signal with opposite phases, and the sequential logic element to be tested includes a first sequential logic element to be tested and a second sequential logic element to be tested. During simulation, the first clock signal and the first data signal are input to the first sequential logic element to be tested to sample the first data signal by using the first clock signal, and the second clock signal and the second data signal are input to the second sequential logic element to be tested to sample the second data signal by using the second clock signal.

Figure 6:
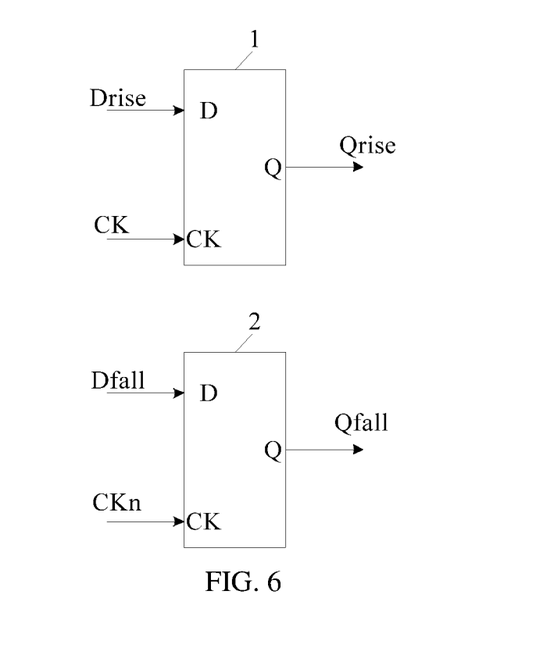
FIG. 6 is a schematic diagram illustrating a circuit structure of a sequential logic element to be tested according to an embodiment of the present disclosure.

For better understanding of the embodiments of the present disclosure, references can be made to FIG. 6. FIG. 6 is a schematic diagram illustrating a circuit structure of a sequential logic element to be tested according to an embodiment of the present disclosure.

In FIG. 6, the sequential logic element to be tested includes a flip-flop 1 and a flip-flop 2. During simulation, a first clock signal CK and a first data signal Drise are input to the flip-flop 1 to sample data "1" of the first data signal Drise by using a rising edge of the first clock signal CK, and sampled data Qrise is output. A second clock signal CKn and a second data signal Dfall are input to the flip-flop 2 to sample data "0" of the second data signal Dfall by using a falling edge of the second clock signal CKn, and sampled data Qfall is output.

A phase of the first data signal Drise is opposite to that of the second data signal Dfall, and a phase of the first clock signal CK is opposite to that of the second clock signal CKn.

Figure 7:
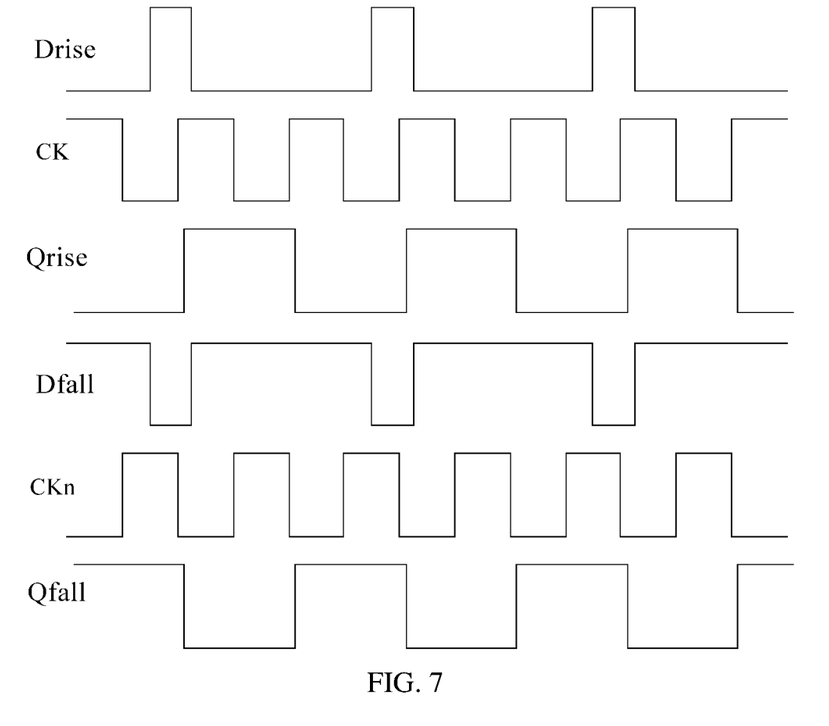
FIG. 7 is a schematic diagram illustrating sequential logic according to an embodiment of the present disclosure.

For better understanding of the embodiments of the present disclosure, references can be made to FIG. 7. FIG. 7 is a schematic diagram illustrating sequential logic according to an embodiment of the present disclosure.

It may be understood that a setup time of the flip-flop 1 is gradually decremented, so that the following evaluation parameters of the flip-flop 1 when the sampled data Qrise output by the flip-flop 1 is toggled from "1" to "0" can be detected: an output delay average value, a target setup time, a metastable time, and a target hold time.

A setup time of the flip-flop 2 is gradually decremented, so that the following evaluation parameters of the flip-flop 2 when the sampled data Qfall output by the flip-flop 2 is toggled from "0" to "1" can be detected: an output delay average value, a target setup time, a metastable time, and a target hold time.

In some embodiments of the present disclosure, the evaluation parameter further includes at least one of the following evaluation parameters: a maximum output delay, which is the larger one of an output delay average value corresponding to the first sequential logic element to be tested and an output delay average value corresponding to the second sequential logic element to be tested; a maximum setup time, which is the larger one of a target setup time corresponding to the first sequential logic element to be tested and a target setup time corresponding to the second sequential logic element to be tested; a maximum hold time, which is the larger one of a target hold time corresponding to the first sequential logic element to be tested and a target hold time corresponding to the second sequential logic element to be tested; an uncertain time interval, which is a sum of the maximum setup time and the maximum hold time; a maximum metastable time, which is the larger one of a metastable time corresponding to the first sequential logic element to be tested and a metastable time corresponding to the second sequential logic element to be tested; a setup time deviation, which is an absolute value of a difference between the target setup time corresponding to the first sequential logic element to be tested and the target setup time corresponding to the second sequential logic element to be tested; and a hold time deviation, which is an absolute value of a difference between the target hold time corresponding to the first sequential logic element to be tested and the target hold time corresponding to the second sequential logic element to be tested.

In some embodiments, the uncertain time interval may be greater than the hold time of the data signal, or may be less than the hold time of the data signal.

In the method for evaluating performance of a sequential logic element provided in this embodiment of the present disclosure, some evaluation parameters of the sequential logic element to be tested when the output of the sequential logic element to be tested is toggled from the target sampled value to the reverse value of the target sampled value are measured or calculated, and the performance of the sequential logic element to be tested can be effectively evaluated more comprehensively and completely based on the evaluation parameters, so that the performance of the sequential logic element to be tested is improved.

Figure 8:
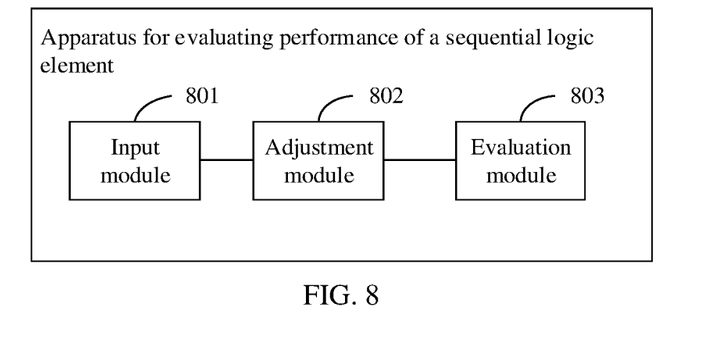
FIG. 8 is a schematic diagram illustrating program modules of an apparatus for evaluating performance of a sequential logic element according to an embodiment of the present disclosure.

Based on the content described in the foregoing embodiments, an embodiment of the present disclosure further provides an apparatus for evaluating performance of a sequential logic element. FIG. 8 is a schematic diagram illustrating program modules of an apparatus for evaluating performance of a sequential logic element according to an embodiment of the present disclosure. The apparatus for evaluating performance of a sequential logic element includes: an input module 801, configured to input a preset clock signal and a data signal to a sequential logic element to be tested, where the sequential logic element to be tested is configured to sample the data signal based on the preset clock signal; an adjustment module 802, configured to decrement a setup time of the sequential logic element to be tested from a first preset value to a second preset value based on a preset decrement step, and record a sampled value output by the sequential logic element to be tested after each decrement of the setup time, where the setup time is a time difference between a target edge of the clock signal and a target edge of a target sampled value in the data signal, the first preset value is determined by a setup time when the sequential logic element to be tested stably outputs the target sampled value, and the second preset value is determined by a setup time when the sequential logic element to be tested stably outputs a reverse value of the target sampled value; and an evaluation module 803, configured to determine an evaluation parameter of the sequential logic element to be tested based on the sampled value output by the sequential logic element to be tested after each decrement of the setup time, and evaluate performance of the sequential logic element to be tested based on the evaluation parameter.

In an exemplary implementation, the evaluation parameter includes an output delay average value, and the evaluation module 803 is configured to determine, based on the sampled value output by the sequential logic element to be tested after each decrement of the setup time, a first setup time value of the sequential logic element to be tested when the sampled value output by the sequential logic element to be tested is toggled from the target sampled value to the reverse value of the target sampled value; calculate a first average value of delay durations between the target edge of the clock signal and the target sampled value output by the sequential logic element to be tested when each decrement is completed in a process of decrementing the setup time of the sequential logic element to be tested from the first preset value to the first setup time value; and determine the first average value as the output delay average value.

In an exemplary implementation, the evaluation parameter further includes a target setup time, and the evaluation module 803 is further configured to select a plurality of smallest delay durations from the delay durations; calculate a sum of an average value of the selected delay durations and a fixed delay offset of the sequential logic element to be tested; and determine a setup time corresponding to the sum of the average value and the fixed delay offset as the target setup time.

In an exemplary implementation, the evaluation parameter further includes a metastable time, and the evaluation module 803 is further configured to draw a curve reflecting the delay duration changes with a number of decrements of the setup time, and determine an inflection point and a peak value of the curve; and obtain a difference between setup times corresponding to the peak value and the inflection point, and use the difference as the metastable time.

In an exemplary implementation, the evaluation parameter further includes a target hold time, and the adjustment module 802 is further configured to decrement a hold time of the sequential logic element to be tested from a third preset value to a fourth preset value based on the preset decrement step, and record a sampled value output by the sequential logic element to be tested after each decrement of the hold time, where the hold time is a time for which the data signal remains stable after the target edge of the clock signal, the third preset value is determined by a hold time when the sequential logic element to be tested stably outputs the target sampled value, and the fourth preset value is determined by a hold time when the sequential logic element to be tested stably outputs the reverse value of the target sampled value; and the evaluation module 803 is further configured to determine, based on the sampled value output by the sequential logic element to be tested after each decrement of the hold time, a first hold time value of the sequential logic element to be tested when the sampled value output by the sequential logic element to be tested is toggled from the target sampled value to the reverse value of the target sampled value; and determine the first hold time value as the target hold time.

In an exemplary implementation, the data signal includes a first data signal and a second data signal with opposite phases, the clock signal includes a first clock signal and a second clock signal with opposite phases, and the sequential logic element to be tested includes a first sequential logic element to be tested and a second sequential logic element to be tested; and the input module 801 is configured to input the first clock signal and the first data signal to the first sequential logic element to be tested to sample the first data signal by using the first clock signal, and input the second clock signal and the second data signal to the second sequential logic element to be tested to sample the second data signal by using the second clock signal.

In an exemplary implementation, the evaluation parameter further includes at least one of the following evaluation parameters: a maximum output delay, which is the larger one of an output delay average value corresponding to the first sequential logic element to be tested and an output delay average value corresponding to the second sequential logic element to be tested; a maximum setup time, which is the larger one of a target setup time corresponding to the first sequential logic element to be tested and a target setup time corresponding to the second sequential logic element to be tested; a maximum hold time, which is the larger one of a target hold time corresponding to the first sequential logic element to be tested and a target hold time corresponding to the second sequential logic element to be tested; an uncertain time interval, which is a sum of the maximum setup time and the maximum hold time; a maximum metastable time, which is the larger one of a metastable time corresponding to the first sequential logic element to be tested and a metastable time corresponding to the second sequential logic element to be tested; a setup time deviation, which is an absolute value of a difference between the target setup time corresponding to the first sequential logic element to be tested and the target setup time corresponding to the second sequential logic element to be tested; and a hold time deviation, which is an absolute value of a difference between the target hold time corresponding to the first sequential logic element to be tested and the target hold time corresponding to the second sequential logic element to be tested.

It should be noted that for content specifically performed by the input module 801, the adjustment module 802, and the evaluation module 803 in this embodiment of the present disclosure, references can be made to related content in the embodiments shown in FIG. 1 to FIG. 7. Details are omitted herein for simplicity.

Further, based on the content described in the foregoing embodiments, an embodiment of the present disclosure further provides an electronic device. The electronic device includes at least one processor and a memory. The memory stores computer executable instructions, and the at least one processor executes the computer executable instructions stored in the memory to implement the steps of the method for evaluating performance of a sequential logic element described in the foregoing embodiments. Details are omitted for simplicity in this embodiment.

Figure 9:
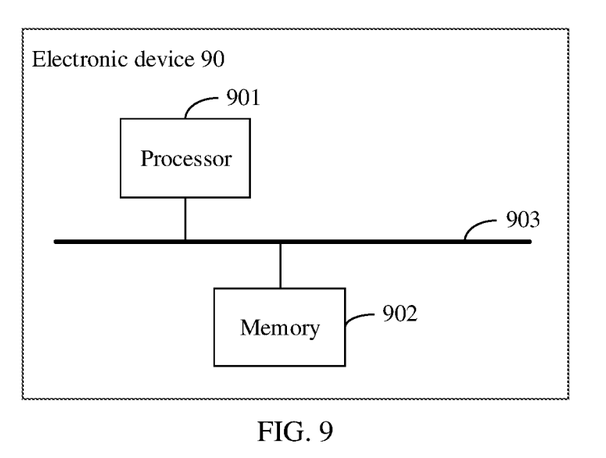
FIG. 9 is a schematic diagram illustrating a hardware structure of an electronic device according to an embodiment of the present disclosure.

For better understanding of the embodiments of the present disclosure, references can be made to FIG. 9. FIG. 9 is a schematic diagram illustrating a hardware structure of an electronic device according to an embodiment of the present disclosure.

As shown in FIG. 9, an electronic device 90 in this embodiment includes a processor 901 and a memory 902.

The memory 902 is configured to store computer executable instructions.

The processor 901 is configured to execute the computer executable instructions stored in the memory, to implement the steps of the method for evaluating performance of a sequential logic element described in the foregoing embodiments. For details, references can be made to related descriptions in the foregoing method embodiments.

In some embodiments, the memory 902 may be independent, or may be integrated with the processor 901.

When the memory 902 is independently disposed, the device further includes a bus 903, configured to connect the memory 902 and the processor 901.

In the several embodiments provided in the present disclosure, it should be understood that the disclosed device and method may be implemented in other manners. For example, the described device embodiment is merely an example. For example, the module division is merely logical function division and may be other division in actual implementation. For example, a plurality of modules may be combined or integrated into another system, or some features may be ignored or not performed. In addition, the displayed or discussed mutual couplings or direct couplings or communication connections may be implemented through some interfaces. The indirect couplings or communication connections between the apparatuses or modules may be implemented in electronic, mechanical, or other forms.

A person of ordinary skill in the art may understand that some or all of the steps of the method embodiments may be implemented by a program instructing related hardware. The program may be stored in a computer-readable storage medium. When the program runs, the steps of the method embodiments are performed. The foregoing storage medium includes various media that can store program code, for example, a ROM, a RAM, a magnetic disk, or an optical disc.

Finally, it should be noted that the foregoing embodiments are merely intended for describing the technical solutions of the present disclosure other than limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A method for evaluating performance of a sequential logic element, comprising:
inputting a preset clock signal and a data signal to a sequential logic element to be tested, the sequential logic element to be tested being configured to sample the data signal based on the preset clock signal;

decrementing a setup time of the sequential logic element to be tested from a first preset value to a second preset value based on a preset decrement step, and recording a sampled value output by the sequential logic element to be tested after each decrement of the setup time, the setup time being a time difference between a target edge of the clock signal and a target edge of a target sampled value in the data signal, the first preset value being determined by a setup time when the sequential logic element to be tested outputs the target sampled value, and the second preset value being determined by a setup time when the sequential logic element to be tested outputs a reverse value of the target sampled value; and determining an evaluation parameter of the sequential logic element to be tested based on the sampled value output by the sequential logic element to be tested after each decrement of the setup time, and evaluating performance of the sequential logic element to be tested based on the evaluation parameter.

2. The method according to claim 1, wherein the evaluation parameter comprises an output delay average value, and the determining an evaluation parameter of the sequential logic element to be tested based on the sampled value output by the sequential logic element to be tested after each decrement of the setup time comprises:

determining, based on the sampled value output by the sequential logic element to be tested after each decrement of the setup time, a first setup time value of the sequential logic element to be tested when the sampled value output by the sequential logic element to be tested is toggled from the target sampled value to the reverse value of the target sampled value;

calculating a first average value of delay durations between the target edge of the clock signal and the target sampled value output by the sequential logic element to be tested when each decrement is completed in a process of decrementing the setup time of the sequential logic element to be tested from the first preset value to the first setup time value; and determining the first average value as the output delay average value.

3. The method according to claim 2, wherein the evaluation parameter further comprises a target setup time, and the determining an evaluation parameter of the sequential logic element to be tested based on the sampled value output by the sequential logic element to be tested after each decrement of the setup time comprises:

selecting a plurality of smallest delay durations from the delay durations;

calculating a sum of an average value of the selected delay durations and a fixed delay offset of the sequential logic element to be tested; and determining a setup time corresponding to the sum of the average value and the fixed delay offset as the target setup time.

4. The method according to claim 3, wherein the evaluation parameter further comprises a metastable time, and the determining an evaluation parameter of the sequential logic element to be tested based on the sampled value output by the sequential logic element to be tested after each decrement of the setup time comprises:

drawing a curve reflecting the delay duration changes with a number of decrements of the setup time, and determining an inflection point and a peak value of the curve; and obtaining a difference between setup times corresponding to the peak value and the inflection point, and using the difference as the metastable time.

5. The method according to claim 4, wherein the evaluation parameter further comprises a target hold time, and the method further comprises:

decrementing a hold time of the sequential logic element to be tested from a third preset value to a fourth preset value based on the preset decrement step, and recording a sampled value output by the sequential logic element to be tested after each decrement of the hold time, wherein the hold time is a time for which the data signal remains stable after the target edge of the clock signal, the third preset value is determined by a hold time when the sequential logic element to be tested outputs the target sampled value, and the fourth preset value is determined by a hold time when the sequential logic element to be tested outputs the reverse value of the target sampled value;

determining, based on the sampled value output by the sequential logic element to be tested after each decrement of the hold time, a first hold time value of the sequential logic element to be tested when the sampled value output by the sequential logic element to be tested is toggled from the target sampled value to the reverse value of the target sampled value; and determining the first hold time value as the target hold time.

6. The method according to claim 5, wherein the data signal comprises a first data signal and a second data signal with opposite phases, the clock signal comprises a first clock signal and a second clock signal with opposite phases, and the sequential logic element to be tested comprises a first sequential logic element to be tested and a second sequential logic element to be tested; and the inputting a preset clock signal and a data signal to a sequential logic element to be tested comprises:

inputting the first clock signal and the first data signal to the first sequential logic element to be tested to sample the first data signal by using the first clock signal, and inputting the second clock signal and the second data signal to the second sequential logic element to be tested to sample the second data signal by using the second clock signal.

7. The method according to claim 6, wherein the evaluation parameter further comprises at least one of the following evaluation parameters:

a maximum output delay, which is the larger one of an output delay average value corresponding to the first sequential logic element to be tested and an output delay average value corresponding to the second sequential logic element to be tested;

a maximum setup time, which is the larger one of a target setup time corresponding to the first sequential logic element to be tested and a target setup time corresponding to the second sequential logic element to be tested;

a maximum hold time, which is the larger one of a target hold time corresponding to the first sequential logic element to be tested and a target hold time corresponding to the second sequential logic element to be tested;

an uncertain time interval, which is a sum of the maximum setup time and the maximum hold time;

a maximum metastable time, which is the larger one of a metastable time corresponding to the first sequential logic element to be tested and a metastable time corresponding to the second sequential logic element to be tested;

a setup time deviation, which is an absolute value of a difference between the target setup time corresponding to the first sequential logic element to be tested and the target setup time corresponding to the second sequential logic element to be tested; and a hold time deviation, which is an absolute value of a difference between the target hold time corresponding to the first sequential logic element to be tested and the target hold time corresponding to the second sequential logic element to be tested.

8. An apparatus for evaluating performance of a sequential logic element, comprising at least one processor and a memory, wherein the memory stores computer executable instructions, and the at least one processor executes the computer executable instructions to:

input a preset clock signal and a data signal to a sequential logic element to be tested, the sequential logic element to be tested being configured to sample the data signal based on the preset clock signal;

decrement a setup time of the sequential logic element to be tested from a first preset value to a second preset value based on a preset decrement step, and record a sampled value output by the sequential logic element to be tested after each decrement of the setup time, the setup time being a time difference between a target edge of the clock signal and a target edge of a target sampled value in the data signal, the first preset value being determined by a setup time when the sequential logic element to be tested outputs the target sampled value, and the second preset value being determined by a setup time when the sequential logic element to be tested outputs a reverse value of the target sampled value; and determine an evaluation parameter of the sequential logic element to be tested based on the sampled value output by the sequential logic element to be tested after each decrement of the setup time, and evaluate performance of the sequential logic element to be tested based on the evaluation parameter.

9. The apparatus according to claim 8, wherein the evaluation parameter comprises an output delay average value, and the at least one processor executes the computer executable instructions to:

determine, based on the sampled value output by the sequential logic element to be tested after each decrement of the setup time, a first setup time value of the sequential logic element to be tested when the sampled value output by the sequential logic element to be tested is toggled from the target sampled value to the reverse value of the target sampled value;

calculate a first average value of delay durations between the target edge of the clock signal and the target sampled value output by the sequential logic element to be tested when each decrement is completed in a process of decrementing the setup time of the sequential logic element to be tested from the first preset value to the first setup time value; and determine the first average value as the output delay average value.

10. The apparatus according to claim 9, wherein the evaluation parameter further comprises a target setup time, and the at least one processor executes the computer executable instructions to:

select a plurality of smallest delay durations from the delay durations;

calculate a sum of an average value of the selected delay durations and a fixed delay offset of the sequential logic element to be tested; and determine a setup time corresponding to the sum of the average value and the fixed delay offset as the target setup time.

11. The apparatus according to claim 10, wherein the evaluation parameter further comprises a metastable time, and the at least one processor executes the computer executable instructions to:

draw a curve reflecting the delay duration changes with a number of decrements of the setup time, and determine an inflection point and a peak value of the curve; and obtain a difference between setup times corresponding to the peak value and the inflection point, and use the difference as the metastable time.

12. The apparatus according to claim 11, wherein the evaluation parameter further comprises a target hold time, and the at least one processor executes the computer executable instructions to:

decrement a hold time of the sequential logic element to be tested from a third preset value to a fourth preset value based on the preset decrement step, and record a sampled value output by the sequential logic element to be tested after each decrement of the hold time, wherein the hold time is a time for which the data signal remains stable after the target edge of the clock signal, the third preset value is determined by a hold time when the sequential logic element to be tested outputs the target sampled value, and the fourth preset value is determined by a hold time when the sequential logic element to be tested outputs the reverse value of the target sampled value; and determine, based on the sampled value output by the sequential logic element to be tested after each decrement of the hold time, a first hold time value of the sequential logic element to be tested when the sampled value output by the sequential logic element to be tested is toggled from the target sampled value to the reverse value of the target sampled value; and determine the first hold time value as the target hold time.

13. The apparatus according to claim 12, wherein the data signal comprises a first data signal and a second data signal with opposite phases, the clock signal comprises a first clock signal and a second clock signal with opposite phases, and the sequential logic element to be tested comprises a first sequential logic element to be tested and a second sequential logic element to be tested; and the at least one processor executes the computer executable instructions to:

input the first clock signal and the first data signal to the first sequential logic element to be tested to sample the first data signal by using the first clock signal, and input the second clock signal and the second data signal to the second sequential logic element to be tested to sample the second data signal by using the second clock signal.

14. The apparatus according to claim 13, wherein the evaluation parameter further comprises at least one of the following evaluation parameters:

a maximum output delay, which is the larger one of an output delay average value corresponding to the first sequential logic element to be tested and an output delay average value corresponding to the second sequential logic element to be tested;
a maximum setup time, which is the larger one of a target setup time corresponding to the first sequential logic element to be tested and a target setup time corresponding to the second sequential logic element to be tested;
a maximum hold time, which is the larger one of a target hold time corresponding to the first sequential logic element to be tested and a target hold time corresponding to the second sequential logic element to be tested;
an uncertain time interval, which is a sum of the maximum setup time and the maximum hold time;
a maximum metastable time, which is the larger one of a metastable time corresponding to the first sequential logic element to be tested and a metastable time corresponding to the second sequential logic element to be tested;
a setup time deviation, which is an absolute value of a difference between the target setup time corresponding to the first sequential logic element to be tested and the target setup time corresponding to the second sequential logic element to be tested; and
a hold time deviation, which is an absolute value of a difference between the target hold time corresponding to the first sequential logic element to be tested and the target hold time corresponding to the second sequential logic element to be tested.

15. A non-transitory computer-readable storage medium configured with instructions executable by one or more processors to cause the one or more processors to perform operations comprising:
inputting a preset clock signal and a data signal to a sequential logic element to be tested, the sequential logic element to be tested being configured to sample the data signal based on the preset clock signal;
decrementing a setup time of the sequential logic element to be tested from a first preset value to a second preset value based on a preset decrement step, and recording a sampled value output by the sequential logic element to be tested after each decrement of the setup time, the setup time being a time difference between a target edge of the clock signal and a target edge of a target sampled value in the data signal, the first preset value being determined by a setup time when the sequential logic element to be tested outputs the target sampled value, and the second preset value being determined by a setup time when the sequential logic element to be tested outputs a reverse value of the target sampled value; and
determining an evaluation parameter of the sequential logic element to be tested based on the sampled value output by the sequential logic element to be tested after each decrement of the setup time, and evaluating performance of the sequential logic element to be tested based on the evaluation parameter.

16. The non-transitory computer-readable storage medium according to claim 15, wherein the evaluation parameter comprises an output delay average value, and the determining an evaluation parameter of the sequential logic element to be tested based on the sampled value output by the sequential logic element to be tested after each decrement of the setup time comprises:
determining, based on the sampled value output by the sequential logic element to be tested after each decrement of the setup time, a first setup time value of the sequential logic element to be tested when the sampled value output by the sequential logic element to be tested is toggled from the target sampled value to the reverse value of the target sampled value;
calculating a first average value of delay durations between the target edge of the clock signal and the target sampled value output by the sequential logic element to be tested when each decrement is completed in a process of decrementing the setup time of the sequential logic element to be tested from the first preset value to the first setup time value; and
determining the first average value as the output delay average value.

17. The non-transitory computer-readable storage medium according to claim 16, wherein the evaluation parameter further comprises a target setup time, and the determining an evaluation parameter of the sequential logic element to be tested based on the sampled value output by the sequential logic element to be tested after each decrement of the setup time comprises:
selecting a plurality of smallest delay durations from the delay durations;
calculating a sum of an average value of the selected delay durations and a fixed delay offset of the sequential logic element to be tested; and
determining a setup time corresponding to the sum of the average value and the fixed delay offset as the target setup time.

18. The non-transitory computer-readable storage medium according to claim 17, wherein the evaluation parameter further comprises a metastable time, and the determining an evaluation parameter of the sequential logic element to be tested based on the sampled value output by the sequential logic element to be tested after each decrement of the setup time comprises:
drawing a curve reflecting the delay duration changes with a number of decrements of the setup time, and determining an inflection point and a peak value of the curve; and
obtaining a difference between setup times corresponding to the peak value and the inflection point, and using the difference as the metastable time.

19. The non-transitory computer-readable storage medium according to claim 18, wherein the evaluation parameter further comprises a target hold time, and the operations performed by the one or more processors further comprises:
decrementing a hold time of the sequential logic element to be tested from a third preset value to a fourth preset value based on the preset decrement step, and recording a sampled value output by the sequential logic element to be tested after each decrement of the hold time, wherein the hold time is a time for which the data signal remains stable after the target edge of the clock signal, the third preset value is determined by a hold time when the sequential logic element to be tested outputs the target sampled value, and the fourth preset value is determined by a hold time when the sequential logic element to be tested outputs the reverse value of the target sampled value;
determining, based on the sampled value output by the sequential logic element to be tested after each decrement of the hold time, a first hold time value of the sequential logic element to be tested when the sampled value output by the sequential logic element to be tested is toggled from the target sampled value to the reverse value of the target sampled value; and determining the first hold time value as the target hold time.

20. The non-transitory computer-readable storage medium according to claim 19, wherein the data signal comprises a first data signal and a second data signal with opposite phases, the clock signal comprises a first clock signal and a second clock signal with opposite phases, and the sequential logic element to be tested comprises a first sequential logic element to be tested and a second sequential logic element to be tested; and the inputting a preset clock signal and a data signal to a sequential logic element to be tested comprises:

inputting the first clock signal and the first data signal to the first sequential logic element to be tested to sample the first data signal by using the first clock signal, and inputting the second clock signal and the second data signal to the second sequential logic element to be tested to sample the second data signal by using the second clock signal.

* * * * *